(12) United States Patent
Hartig

(10) Patent No.: US 7,534,466 B2
(45) Date of Patent: May 19, 2009

(54) METHODS AND EQUIPMENT FOR DEPOSITING COATINGS HAVING SEQUENCED STRUCTURES

(75) Inventor: Klaus Hartig, Avoca, WI (US)

(73) Assignee: Cardinal CG Company, Eden Prairie, MN (US)

( * ) Notice: Subject to any disclaimer, the term of this patent is extended or adjusted under 35 U.S.C. 154(b) by 349 days.

(21) Appl. No.: 11/273,979

(22) Filed: Nov. 15, 2005

(65) Prior Publication Data

US 2006/0105103 A1    May 18, 2006

Related U.S. Application Data

(60) Provisional application No. 60/627,914, filed on Nov. 15, 2004.

(51) Int. Cl.
*B05D 5/06* (2006.01)
*C23C 16/00* (2006.01)
*B05D 1/36* (2006.01)

(52) U.S. Cl. ............... 427/166; 427/248.1; 427/209

(58) Field of Classification Search ............ 427/160, 427/161, 162, 164, 165, 166, 167, 168, 209, 427/248.1, 255.11, 255.15, 255.18, 255.19, 427/255.5, 255.7

See application file for complete search history.

(56) References Cited

U.S. PATENT DOCUMENTS

| | | | |
|---|---|---|---|
| 3,528,906 A | 9/1970 | Cash | 204/298 |
| 3,844,924 A | 10/1974 | Cunningham | 204/298 |
| 3,911,579 A | 10/1975 | Lane | |
| 3,968,018 A | 7/1976 | Lane | 204/192 |
| 4,012,119 A | 3/1977 | Adams | |
| 4,107,350 A | 8/1978 | Berg | 427/38 |
| 4,356,073 A | 10/1982 | McKelvey | |
| 4,422,916 A | 12/1983 | McKelvey | |
| 4,466,258 A | 8/1984 | Sando | 68/5 |
| 4,834,857 A | 5/1989 | Gillery | |
| 4,894,133 A | 1/1990 | Hedgcoth | 204/192.15 |
| 4,990,234 A | 2/1991 | Szczyrbowski | |
| 5,032,421 A | 7/1991 | Sarma | 427/38 |

(Continued)

FOREIGN PATENT DOCUMENTS

DE    3906453    11/1990

(Continued)

OTHER PUBLICATIONS

Hans-Joachim Becker et al., "Herstellung und Eigenschaften von Flachgläsem, die mittels Hochvakuum-zerstäubungsverfahrens beschichtet wurden" Magazine Silikattechnik 36 (1985) Issue 5.

(Continued)

*Primary Examiner*—Michael Cleveland
*Assistant Examiner*—Michael G Miller
(74) *Attorney, Agent, or Firm*—Fredrikson & Byron, P.A.

(57) ABSTRACT

Methods and equipment are provided for processing sheet-like substrates. The methods and equipment are useful for depositing coatings on both major surfaces of a sheet-like substrate. Also provided are substrates with coatings on both major surfaces. Preferably, the coatings on the opposed major surfaces of a substrate have different structures, yet share a common structural sequence of at least two film regions, and in some embodiments at least three film regions.

22 Claims, 8 Drawing Sheets

U.S. PATENT DOCUMENTS

| | | | |
|---|---|---|---|
| 5,071,206 A | 12/1991 | Hood | |
| 5,211,759 A | 5/1993 | Zimmermann | 118/723 |
| 5,286,524 A | 2/1994 | Slutz | 427/249 |
| 5,306,547 A | 4/1994 | Hood | |
| 5,366,764 A | 11/1994 | Sunthankar | 427/248.1 |
| 5,424,130 A | 6/1995 | Nakanishi | 428/410 |
| 5,529,631 A | 6/1996 | Yoshikawa | 118/718 |
| 5,563,734 A | 10/1996 | Wolfe | |
| 5,616,532 A | 4/1997 | Heller | 502/242 |
| 5,683,561 A | 11/1997 | Hollars | 204/298 |
| 5,698,262 A | 12/1997 | Soubeyrand | 428/255 |
| 5,719,705 A * | 2/1998 | Machol | 359/581 |
| 5,724,187 A | 3/1998 | Varaprasad | 359/608 |
| 5,750,265 A | 5/1998 | Goodman | |
| 5,762,674 A | 6/1998 | Maltby | 65/60.1 |
| 5,789,040 A | 8/1998 | Martinu | 427/575 |
| 5,814,195 A | 9/1998 | Lehan | |
| 5,853,866 A | 12/1998 | Watanabe | 428/312 |
| 5,874,701 A | 2/1999 | Watanabe | 204/157 |
| 5,939,194 A | 8/1999 | Hashimoto | 428/411 |
| 5,948,538 A | 9/1999 | Brochot et al. | 428/432 |
| 5,961,843 A | 10/1999 | Hayakawa | 210/748 |
| 5,962,115 A * | 10/1999 | Zmelty et al. | 428/216 |
| 6,013,372 A | 1/2000 | Hayakawa | 428/411 |
| 6,054,024 A | 4/2000 | Toyama | |
| 6,090,489 A | 7/2000 | Hayakawa | 428/409 |
| 6,103,363 A | 8/2000 | Boire | |
| 6,139,803 A | 10/2000 | Watanabe | 422/121 |
| 6,165,256 A | 12/2000 | Hayakawa | 106/13 |
| 6,171,659 B1 | 1/2001 | Vanden Brande | |
| 6,191,062 B1 | 2/2001 | Hayakawa | 502/159 |
| 6,193,378 B1 | 2/2001 | Tonar | 359/603 |
| 6,210,779 B1 | 4/2001 | Watanabe | 428/208 |
| 6,319,326 B1 | 11/2001 | Koh | 118/718 |
| 6,329,925 B1 | 12/2001 | Skiver | 340/815.4 |
| 6,333,084 B1 | 12/2001 | Woodard | 428/34 |
| 6,365,010 B1 | 4/2002 | Hollars | |
| 6,397,776 B1 | 6/2002 | Yang | 118/723 |
| 6,428,172 B1 | 8/2002 | Hutzel | 359/838 |
| 6,447,123 B2 | 9/2002 | Tonar | 359/604 |
| 6,480,335 B1 | 11/2002 | Nakaho | 359/584 |
| 6,500,690 B1 | 12/2002 | Yamagishi | 438/57 |
| 6,501,387 B2 | 12/2002 | Skiver | 340/815.4 |
| 6,660,365 B1 | 12/2003 | Krisko | 428/149 |
| 6,964,731 B1 | 11/2005 | Krisko | 204/192 |
| 6,974,629 B1 | 12/2005 | Krisko | 428/432 |
| 2002/0012779 A1 | 1/2002 | Miyashita | |
| 2002/0046945 A1 | 4/2002 | Hosokawa | |
| 2002/0102352 A1 | 8/2002 | Hartig | 427/165 |
| 2002/0189938 A1 | 12/2002 | Baldwin | |
| 2003/0048538 A1 | 3/2003 | Tonar | 359/604 |
| 2004/0020761 A1 * | 2/2004 | Thomsen et al. | 204/192.12 |
| 2004/0163945 A1 | 8/2004 | Hartig | 427/569 |
| 2005/0106397 A1 | 5/2005 | Krisko | 428/432 |
| 2005/0244678 A1 | 11/2005 | Arfsten | |

FOREIGN PATENT DOCUMENTS

| | | |
|---|---|---|
| DE | 4313284 | 10/1994 |
| EP | 0 637 572 | 2/1995 |
| EP | 0 689 962 | 1/1996 |
| EP | 0737513 | 10/1996 |
| EP | 0 820 967 | 1/1998 |
| EP | 0870530 | 10/1998 |
| EP | 1179515 | 2/2002 |
| JP | 2005-213585 | 8/2005 |
| WO | 89/10430 | 11/1989 |
| WO | 92/17621 | 10/1992 |
| WO | WO 00/37376 | 6/2000 |
| WO | WO 00/37377 | 6/2000 |
| WO | WO 03/095695 | 11/2003 |

OTHER PUBLICATIONS

Hans-Joachin Gläser, "Beschichtung großflächiger Substratscheiben durch Kathodenzerstäubung" Glastechnische Berichte 56 (1983) No. 9.

MikroElektronick—High-rate Sputtering System for Two-Sided Coating (HZS-04).

Vakuumbeschichtung 5 Anwendungen Teil II, VDI Verlag 1993, ISBN 3-18-401315-4.

English-langauge Abstract for Japanese Patent Publication 2005-213585 (Konica Minolta).

"U.S. Appl. No. 11/129,820 Non Final Office Action mailed Nov. 5, 2008", 32 pgs.

\* cited by examiner

METHODS AND EQUIPMENT FOR DEPOSITING COATINGS HAVING SEQUENCED STRUCTURES

CROSS REFERENCE To RELATED APPLICATIONS

The present application claims priority to provisional U.S. patent application filed Nov. 15, 2004 and assigned Ser. No. 60/627,914, the entire disclosure of which is incorporated herein by reference.

FIELD OF THE INVENTION

The present invention provides coatings for glass and other substrates. This invention also provides methods and equipment for depositing coatings on glass and other substrates. More particularly, this invention provides thin film coatings, methods and equipment for depositing thin film coatings, and substrates bearing such coatings.

BACKGROUND OF THE INVENTION

A wide variety of coatings can be applied to glass sheets and other sheet-like substrates to provide the substrates with desired properties and characteristics. Well known coating types include low-emissivity coatings, solar control coatings, hydrophilic coatings, hydrophobic coatings, photocatalytic coatings, photovoltaic coatings, electrochromic coatings, mirror coatings, and antireflective coatings. In some cases, it is desirable to apply coatings to both sides of a sheet-like substrate. For example, a substrate may be provided with a low-emissivity coating on one side and a photocatalytic coating on the other side. Alternatively, a substrate may be provided with a low-emissivity coating on one side and a hydrophobic coating on the other side. Further, a substrate may be provided with a low-emissivity coating on one side and a hydrophilic coating on the other side. Still further, a substrate may be provided with a photocatalytic coating on one side and a mirror coating on the other side. Many further variants are possible.

When coatings are applied to both sides of a substrate, the coating deposition can be performed, for example, using a coater that is adapted only for downward deposition (e.g., using a coater adapted only for conventional downward sputtering). This can involve applying a coating to one side of the substrate in a first pass through the coater, and thereafter applying another coating to the other side of the substrate in a second pass through the coater, flipping the substrate between the first and second passes. Alternatively, one side of a substrate can be coated on one side by conveying the substrate through a first coater (e.g., a coater adapted for pyrolytic deposition), and the other side of the substrate can be coated by subsequently conveying the substrate through a second coater (e.g., a coater adapted for sputter deposition). Such processes, however, are inefficient and are not believed to be feasible for commercial production.

Attempts have been made to provide more efficient methods for coating both sides of a sheet-like substrate, generally by coating both sides of the substrate in a single pass through a single coating apparatus. Reference is made to U.S. Pat. No. 5,683,561 (Hollars et al.) and U.S. Pat. No. 5,762,674 (Maltby, Jr. et al.), the entire contents of each of which are incorporated herein by reference. Particularly useful technology for coating both sides of a substrate is disclosed in International Patent Application PCT/US99/02208 (International Publication No. WO 00/37377 (Bond et al.)), the entire contents of which are incorporated herein by reference.

While these recent technologies show great improvement over traditional methods, there is a need for more sophisticated technologies in which coatings are applied to both sides of a substrate. For example, with the rapid evolution of new and more complex coatings, and with the ongoing advances in coating design and deposition equipment, there is a need for more efficient methods in which both sides of a substrate can be coated with high quality coatings. This is particularly true with respect to glass sheets and other large-area substrates, especially those designed for architectural and automotive glass applications. Finally, there is a need for coating structures that optimize not only coating properties, but also production efficiency in terms of the methods used and the equipment required.

DETAILED DESCRIPTION OF PREFERRED EMBODIMENTS

Figure 1:
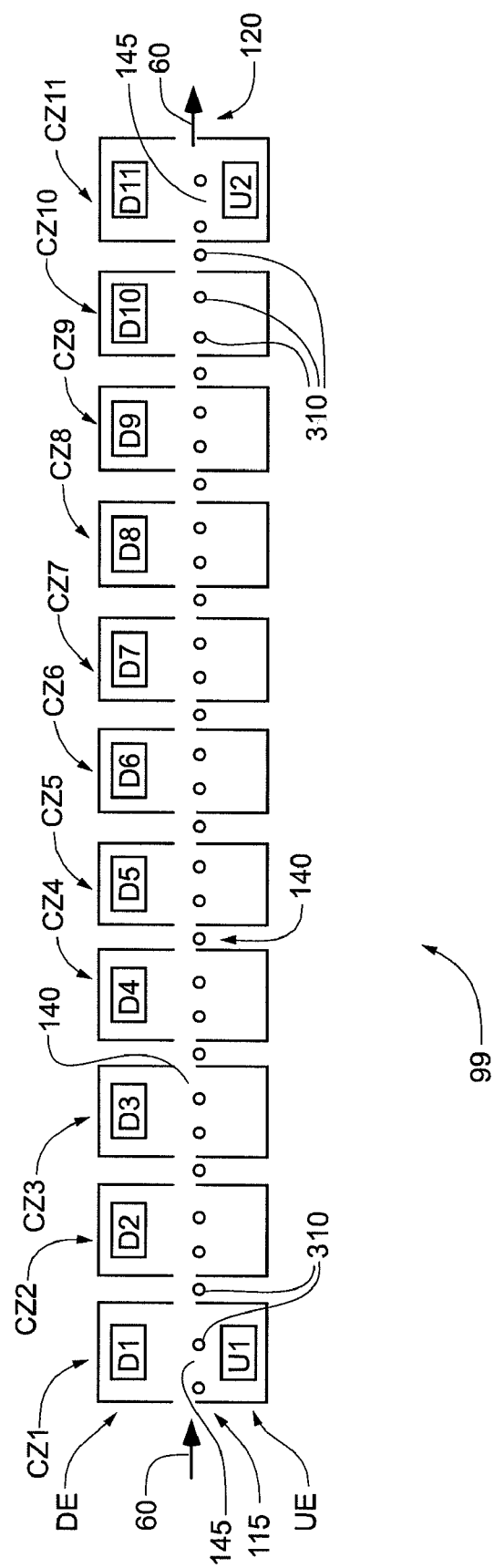
FIG. 1 is a schematic side view of a coater in accordance with certain embodiments of the present invention.

The following detailed description is to be read with reference to the drawings, in which like elements in different drawings have like reference numerals. The drawings, which are not necessarily to scale, depict selected embodiments and are not intended to limit the scope of the invention. Skilled artisans will recognize that the examples provided herein have many useful alternatives that fall within the scope of the invention.

A variety of substrates are suitable for use in the present invention. In most cases, the substrate 10 is a sheet of transparent material (i.e., a transparent sheet). However, the substrate 10 is not required to be transparent. For example, opaque substrates may be useful in some cases. It is anticipated, however, that for most applications, the substrate will comprise a transparent or translucent material, such as glass or clear plastic. In many cases, the substrate 10 will be a glass pane. A variety of glass types can be used, and soda-lime glass is expected to be preferred.

Substrates of various sizes can be used in the present invention. Commonly, large-area substrates are used. Certain embodiments involve a substrate 10 having a major dimension (e.g., a width or length) of at least about 0.5 meter, preferably at least about 1 meter, perhaps more preferably at least about 1.5 meters (e.g., between about 2 meters and about 4 meters), and in some cases at least about 3 meters.

Substrates of various thicknesses can be used in the present invention. Commonly, substrates with a thickness of about 1-5 mm are used. Some embodiments involve a substrate 10 with a thickness of between about 2.3 mm and about 4.8 mm, and perhaps more preferably between about 2.5 mm and about 4.8 mm. In some cases, a sheet of glass (e.g., soda-lime glass) with a thickness of about 3 mm is used.

In certain embodiments, the invention provides a method for depositing sequenced coatings on opposite sides of a sheet-like substrate (e.g., a glass sheet). This method is advantageous in that it allows the manufacturer to coat both sides of a substrate with high quality coatings in a very efficient manner. It avoids the expense and complication that would be associated with either adding more deposition chambers to existing coaters or acquiring new coaters that have an unusually large number of chambers. It also can achieve particularly high quality coatings, in which films that are deposited simultaneously in a shared chamber are not contaminated from any overspray or commingling of different types of materials. Many other advantages are also achieved, as will be apparent given the present disclosure.

Generally, the present method involves depositing the coatings on a substrate in a single pass of the substrate through a single coater. The coatings are applied on opposite major surfaces of the substrate. The precise nature of these two coatings is not limited in basic embodiments of the invention. Rather, in these embodiments, the substrate is conveyed through the coater and films are deposited on both sides of the substrate in such a way that, irrespective of the particular structure of each coating, the coatings that result on both sides of the substrate share a common sequence of film regions. That is, the first coating (e.g., the coating on the substrate's top surface) includes a certain sequence of film regions, and the second coating (e.g., the coating on the substrate's bottom surface) includes the same sequence of film regions. One or both coatings can, and commonly will, include other film regions in addition to those that are part of the noted sequence.

Preferably, the present method involves providing a coater 99 that includes downward coating equipment DE, upward coating equipment UE, and a substrate support 140 defining a path of substrate travel 60 extending through the coater. The downward coating equipment DE is adapted for coating the top major surface of a substrate 10 positioned on the substrate support 140, and the upward coating equipment is adapted for coating the bottom major surface 12 of a substrate 10 on the support 140. Preferably, the downward coating equipment is mounted above (i.e., at a higher elevation than) the path of substrate travel, while the upward coating equipment is mounted below (i.e., at a lower elevation than) the path of substrate travel.

FIGS. 1-4 and 7 exemplify various embodiments of the coater 99. Generally, the downward coating equipment DE comprises at least one downward coating apparatus D, and the upward coating equipment UE comprises at least one upward coating apparatus U. Preferably, the coater is a vacuum coater. That is, the coater 99 is preferably adapted for carrying out at least one vacuum deposition process, such as sputtering, chemical vapor deposition, evaporation, ion-assisted deposition, etc.

The coater 99 preferably includes at least one chamber in which a controlled environment can be established. Each such chamber is preferably adapted for use at (e.g., is adapted for establishing and maintaining therein) a total gas pressure of less than about 140 torr., more preferably less than about 0.1 torr., and perhaps most commonly between about 1 mtorr. and about 0.1 torr. (e.g., between about 1 mtorr. and about 30 mtorr.). Thus, the coater 99 preferably has gas delivery and pumping systems adapted for establishing and maintaining pressures within any range or ranges described in this paragraph.

The coater 99 comprises one or more deposition chambers. Virtually any number of chambers can be used. In certain embodiments, the coater comprises a series of connected chambers. For example, the coater 99 may comprise a line of connected deposition chambers (i.e., a coating line). In more detail, such a coating line may comprise a series of chambers aligned and connected so that a substrate (or a plurality of spaced-apart sheet-like substrates, such as glass sheets) horizontally supported on spaced-apart transport rollers can be conveyed through the chambers of the line sequentially. Preferably, such a coating line includes narrow evacuated tunnels, which connect adjacent chambers, through which the horizontally-oriented substrate is conveyed from one chamber to the next. During film deposition, the substrate 10 is typically conveyed through all the chambers of such a coating line. It is to be appreciated that the coater 99 can include a plurality of chambers aligned and connected in this manner, regardless of the particular deposition processes that are performed in such chambers.

Figure 8:
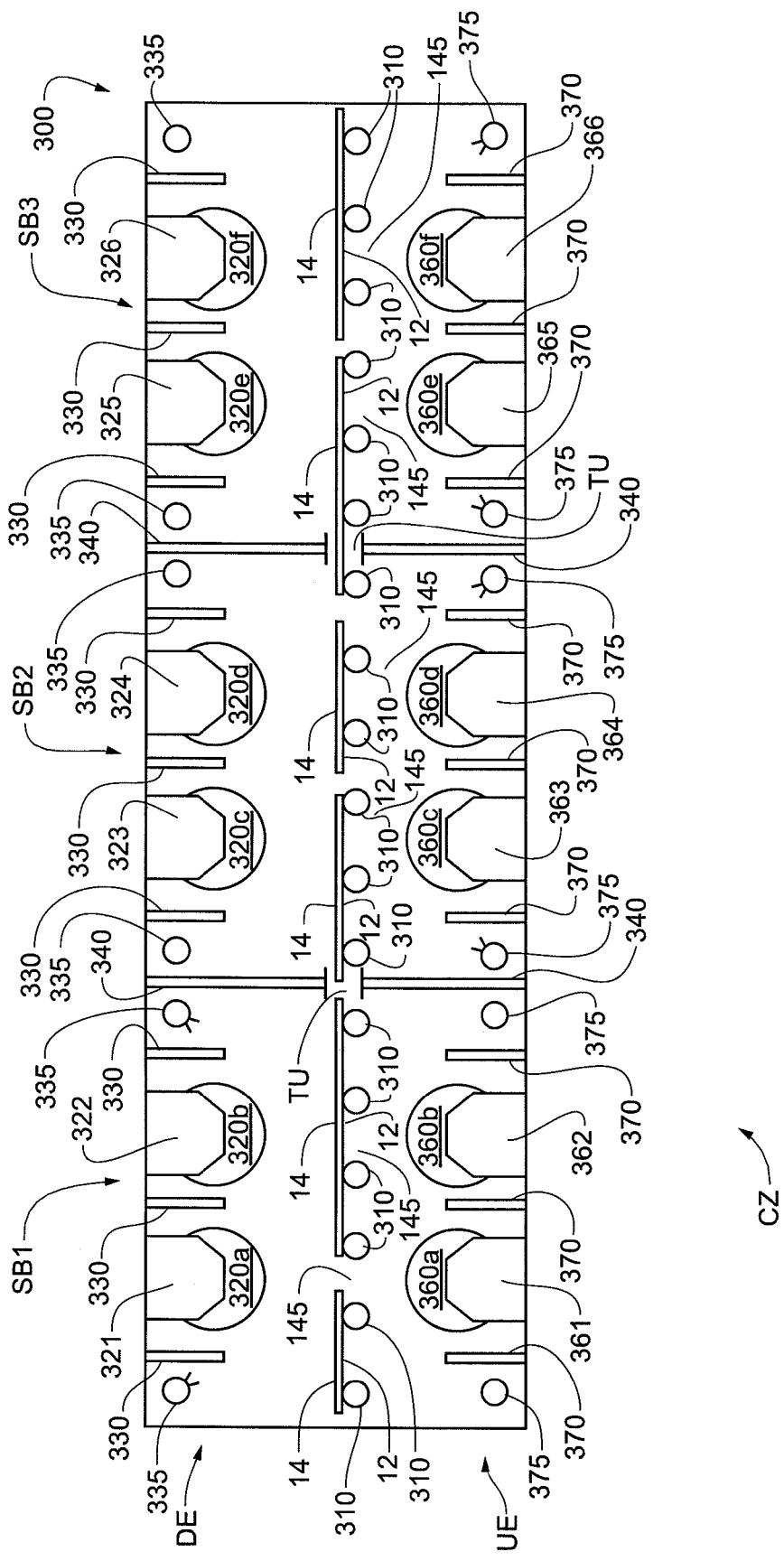
FIG. 8 is a schematic side view of a coat zone in accordance with certain embodiments of the invention.

Generally, adjacent deposition chambers have physical barriers between them. For example, FIG. 8 depicts a coat zone comprising three chambers (or "bays") SB, wherein adjacent chambers are separated by chamber walls 340 (e.g., upper and lower walls each respectively being above and below a narrow tunnel TU through which substrates can be conveyed from one chamber to the next).

The coater 99 can include different chambers adapted respectively for carrying out different deposition processes. For example, the coater can include one or more chambers in which sputtering is performed and one or more chambers in which ion beam film deposition is performed. Further, the coater 99 can include one or more chambers in which sputtering is performed and one or more chambers in which chemical vapor deposition is performed. Alternatively, the coater can include one or more chambers in which chemical vapor deposition is performed and one or more chambers in which evaporation is performed. Various alternatives of this nature will be apparent to skilled artisans given the present teaching as a guide.

The coater 99 comprises a substrate support 140 defining a path of substrate travel 60 extending through the coater. Preferably, the path of substrate travel 60 extends generally or substantially horizontally through the coater 99. In embodiments where the coater 99 includes more than one chamber, the chambers are typically connected such that the path of substrate travel 60 extends through each of the chambers. FIGS. 1-4 and 7 exemplify embodiments wherein the substrate support 140 defines a path of substrate travel 60 that extends entirely through the coater 99 between a coater inlet 115 and a coater outlet 120.

Preferably, the substrate support 140 is configured for maintaining (e.g., supporting) the substrate 10 in a generally or substantially horizontal position while the substrate is being coated (e.g., during conveyance of the substrate 10 through the coater 99). Thus, the support 140 desirably is adapted to convey a sheet-like substrate 10, and preferably multiple sheet-like substrates spaced-apart from one another, through the coater 99 while maintaining the/each substrate 10 in a generally or substantially horizontal orientation (e.g., wherein a top major surface 14 of the/each substrate 10 is oriented upwardly while a bottom major surface 12 of the/each substrate is oriented downwardly). Preferably, the substrate support 140 comprises a plurality of spaced-apart transport rollers 310. The transport rollers in certain embodiments are spaced generally or substantially evenly apart along substantially the entire path of substrate travel 60. Typically, at least one of the rollers is rotated (e.g., by energizing a motor operably connected to the roller) such that the substrate 10 is conveyed through the coater 99 along the path of substrate travel 60. When the substrate 10 is conveyed over such rollers, the bottom surface 12 of the substrate is in direct physical (i.e., supportive) contact with the rollers. Thus, certain methods of the invention involve a glass sheet and a substrate support comprising a plurality of spaced-apart transport rollers, wherein the method comprises rotating at least one of the transport rollers to facilitate conveyance of the glass sheet, such that the bottom major surface of the glass sheet comes into direct physical contact with the rollers during conveyance.

The substrate 10 is typically conveyed through the coater 99 at speeds between about 100-500 inches per minute. In certain embodiments, the substrate 10 is a sheet of glass and is on (e.g., positioned on top of) the support 140 during conveyance. In some embodiments of this nature, other sheets of glass are also positioned on the support 140, such sheets of glass being spaced apart from one another on the support 140 and conveyed in such a spaced-apart configuration. While the illustrated support 140 comprises a plurality of transport rollers 310, it is to be appreciated that other types of substrate supports can be used.

In embodiments wherein the substrate support 140 consists of transport rollers, the rollers can be of any conventional structure. It has been found that good results can be obtained by employing cylindrical (e.g., aluminum) tubes about which a rope is spirally wound, such rope providing the surface with which the substrate is in direct contact. The rope, for example, can be formed of Kevlar™, i.e., poly-para-phenylene terephthalamide, or another polymer (e.g., nylon-like polymer). Preferably, a high melting point polymer is used (e.g., a polymer having a melting point above the maximum processing temperature established in the desired deposition process, e.g., at least about 165 degrees C., more preferably at least about 200 degrees C., and perhaps optimally at least about 400 degrees C.). Cylinders carrying a spirally-wound rope (or a plurality of individual bands) are particularly desirable for embodiments wherein an upward coating process is performed, as the rope reduces the area of contact between the rollers and the substrate's bottom surface and thus provides a particularly non-damaging damaging support for the substrate's freshly-coated bottom surface. Thus, in certain embodiments, the substrate support comprises a plurality of spaced-apart rollers each comprising at least one rope disposed about a cylinder.

In embodiments wherein the support 140 comprises spaced-apart rollers 310, the spacing of the rollers 310 is preferably kept fairly small to permit small substrates to be processed without any significant risk of having the substrates fall between the spaced-apart rollers. The maximum safe spacing is preferably determined on a case-by-case basis for a desired range of substrate sizes.

While small substrates can be coated, the invention is particularly advantageous for processing large-area substrates, such as glass sheets for architectural and automotive glass applications. Thus, in certain methods of the invention, the substrate conveyed through the coater is a large-area substrate having a major dimension of at least about 0.5 meter. With large-area substrates in particular (especially those formed of glass), it is desirable to convey the substrate 10 through the coater in a generally or substantially horizontal orientation, rather than in a vertical orientation.

As noted above, the coater 99 includes both downward coating equipment DE and upward coating equipment UE. The downward equipment DE is adapted for coating the top major surface 14 of the substrate 10, while the upward equipment UE is adapted for coating the bottom major surface 12 of the substrate. Thus, the downward equipment DE is preferably mounted above the path of substrate travel 60, while the upward equipment UE is preferably mounted below the path of substrate travel.

In certain embodiments, the coater is a vacuum coater, the downward coating equipment comprises at least one downward vacuum-coating apparatus, and the upward coating equipment comprises at least one upward vacuum-coating apparatus. Preferably, the downward coating equipment comprises a plurality of downward vacuum-coating apparatuses, and the upward coating equipment comprises a plurality of upward vacuum-coating apparatuses. Various embodiments of this nature are described below.

Figure 2:
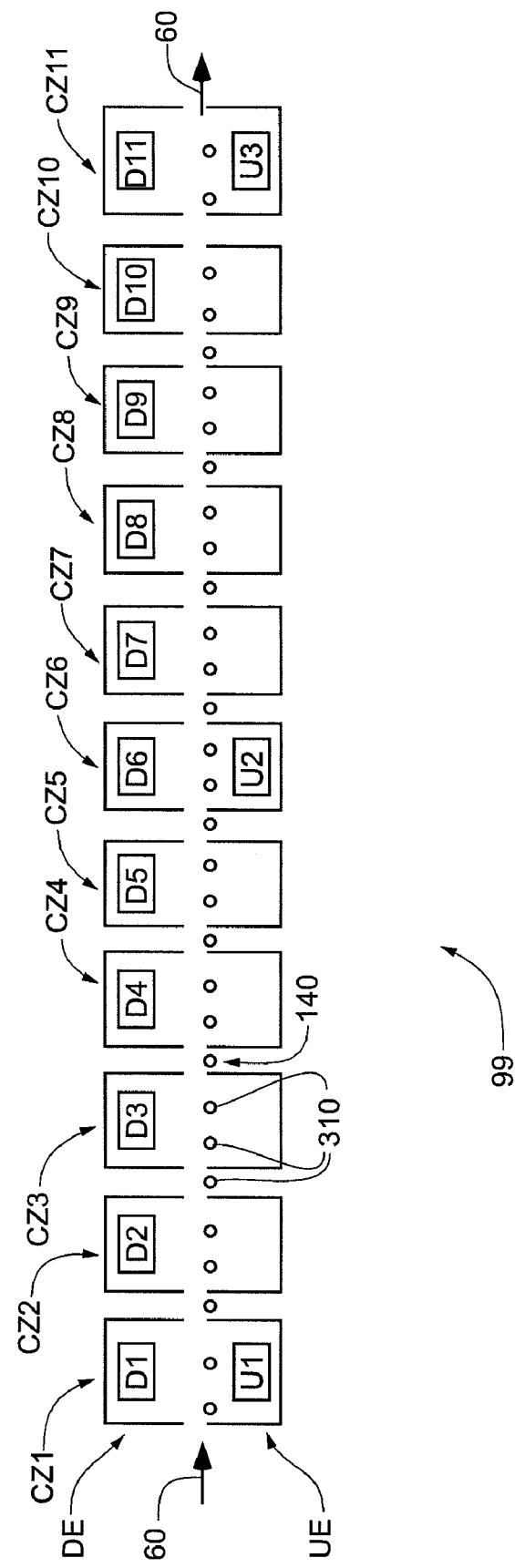
FIG. 2 is a schematic side view of a coater in accordance with certain embodiments of the invention.

With respect to the downward coating equipment DE, each downward coating apparatus preferably is mounted inside the coater 99 at a location above the path of substrate travel 60 and is adapted for coating the top surface 14 of the substrate. FIGS. 1-4 and 7-8 depict embodiments wherein the downward coating equipment DE comprises a plurality of downward coating apparatuses. For example, FIGS. 1-2 depict embodiments wherein the coater 99 comprises at least eleven downward coating apparatuses D1-D11. It is to be understood that the coater 99 can comprise any number of downward coating apparatuses.

Figure 3:
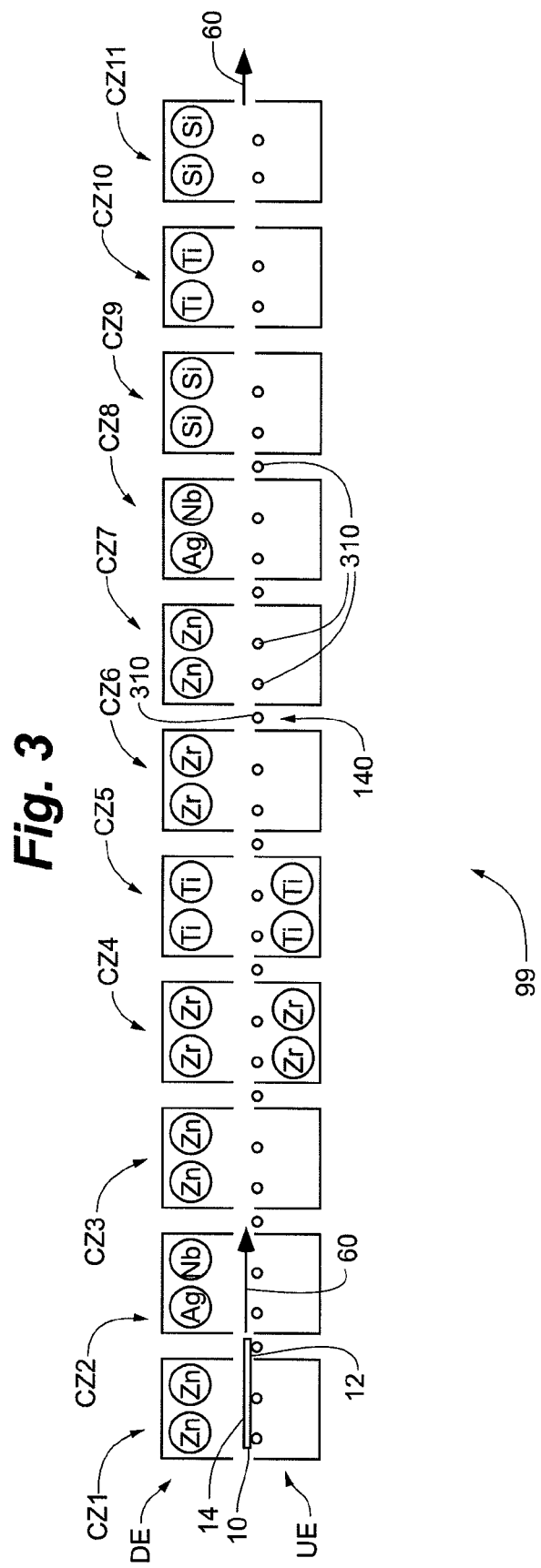
FIG. 3 is a schematic side view of a coater in accordance with certain embodiments of the invention.
Figure 4:
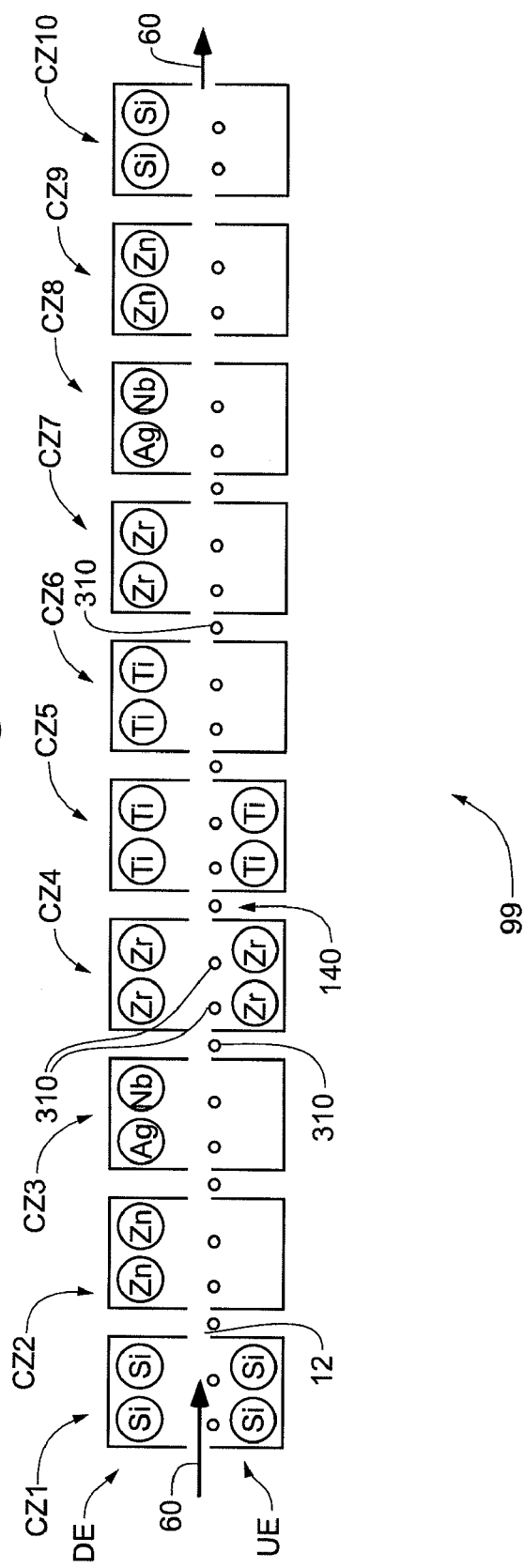
FIG. 4 is a schematic side view of a coater in accordance with certain embodiments of the invention.
Figure 7:
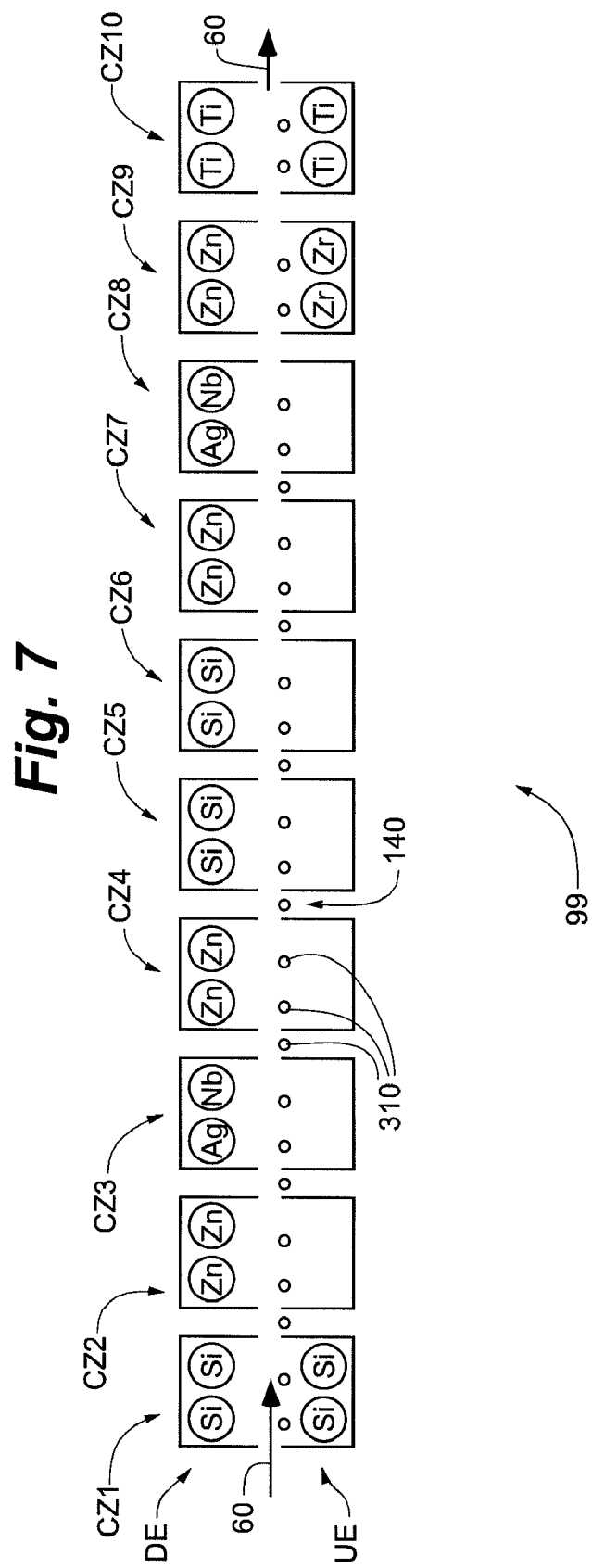
FIG. 7 is a schematic side view of a coater in accordance with certain embodiments of the invention.

Each downward coating apparatus in the coater 99 can be any type of downward coating apparatus. In certain embodiments, the coater includes at least one downward sputtering apparatus. In these embodiments, each downward sputtering apparatus comprises an upper sputtering target mounted above the path of substrate travel. FIG. 8 depicts an exemplary coat zone CZ in accordance with one such embodiment. Here, the coat zone CZ has three chambers (or "bays") SB1-SB3. The specific configuration of the coater 99, however, in terms of its grouping of chambers/bays into coat zones will vary depending on the particular type of coater that is used. For example, each coat zone can alternatively comprise one, two, or more than three bays. FIGS. 3-4 and 7 illustrate coat zones CZ that are each shown as having a single chamber/bay, although each coat zone CZ can have two, three, or more bays, as desired.

Referring again to FIG. 8, each chamber SB is illustrated as having two upper targets 320. This, however, is by no means required. Rather, a given chamber SB can be equipped with virtually any desired number of upper targets. For example, a given chamber can have no upper targets, only one upper target, etc. Preferably, each upper target 320 is adjacent to one or more upper gas distribution pipes 335 positioned (e.g., each having at least one gas-delivery outlet) above the path of substrate travel. Each upper target 320 also is also preferably adjacent to one or more upper anodes 330 positioned above the path of substrate travel.

Each target in FIG. 8 is shown as being a cylindrical target, although planar targets can be used as well. Preferably, each provided sputtering target includes a magnet assembly positioned adjacent the target body (mounted inside a cylindrical target, mounted behind a planar target, etc.).

In certain embodiments, the coater 99 includes at least one downward chemical vapor deposition (CVD) apparatus. Such an apparatus may comprise a gas delivery system for delivering precursor gas to the upper region of the coater (i.e., the region of the coater above the path of substrate travel). Preferably, such an apparatus comprises a gas-delivery outlet located above the path of substrate travel, such that from the precursor gas, coating material condenses upon the top surface 14 of the substrate 10. A CVD apparatus of this nature will typically comprise a gas supply from which the precursor gas is delivered through a gas line, out of the gas outlet, and into the upper region of the coater. If so desired, such a downward chemical vapor deposition apparatus can be a plasma-enhanced chemical vapor deposition apparatus of the type described in U.S. patent application Ser. No. 10/739,887 now U.S. Pat. No. 7,157,123, entitled "Plasma-Enhanced Film Deposition" (Hartig), the entire teachings of which are incorporated herein by reference.

In certain embodiments, the coater 99 includes at least one downward coating apparatus comprising an ion gun. An upper ion gun of this nature can be adapted for carrying out any desired ion-assisted deposition (IAD) process. For example, such an ion gun can be adapted for direct film deposition. Alternatively, such an ion gun can be part of an ion beam sputter deposition source comprising an upper sputtering target against which the ion gun accelerates ions, such that atoms of the target material are ejected from the target downwardly toward the substrate's top surface. These types of IAD methods are known in the art, as are many other suitable IAD methods.

With respect to the upward coating equipment UE, each upward coating apparatus preferably is mounted inside the coater 99 at a location below the path of substrate travel and is adapted for coating the bottom surface 12 of the substrate. FIGS. 1-4 and 7-8 depict embodiments wherein the upward coating equipment UE comprises a plurality of upward coating apparatuses. For example, FIG. 1 depicts an embodiment wherein the coater 99 comprises at least two upward coating apparatuses U1-U2, and FIG. 2 depicts an embodiment wherein the upward coating equipment comprises at least three upward coating apparatuses U1-U3. It is to be understood that the coater 99 can comprise any number of upward coating apparatuses.

Each upward coating apparatus in the coater 99 can be any type of upward coating apparatus. In certain embodiments, the coater includes at least one upward sputtering apparatus. In these embodiments, each upward sputtering apparatus includes a lower sputtering target mounted below the path of substrate travel. This is perhaps best appreciated with reference to FIG. 8. Here, each upward sputtering apparatus 361-366 preferably is provided adjacent to one or more lower gas distribution pipes 375 positioned (e.g., each having at least one gas-delivery outlet) below the path of substrate travel 60. Thus, in FIG. 8, the illustrated coat zone CZ includes lower sputtering targets 360a-360f and lower gas distribution pipes 375 adjacent the lower targets. Also shown in FIG. 8 are optional lower anodes 370, which preferably are positioned below the path of substrate travel and adjacent to at least one lower target 360. Each lower target 360 also desirably comprises a magnet assembly, as described above. Particularly useful upward sputtering apparatuses are described in U.S. patent application Ser. No. 09/868,542 now U.S. Pat. No. 6,964,731, Ser. No. 09/868,543 now U.S. Pat. No. 6,974,629, Ser. No. 09/979,314 now U.S. Pat. No. 6,716,369, Ser. No. 09/572,766 now abandoned, and Ser. No. 09/599,301 now U.S. Pat. No. 6,660,365, the entire contents of each of which are incorporated herein by reference.

In certain embodiments, the coater 99 includes at least one upward evaporation coating apparatus. Such an apparatus may comprise a source of coating material to be evaporated, the source typically being located beneath the path of substrate travel. This source of material can be provided in the form of a boat, crucible, strip, or coil that contains, or is formed of, the desired source material. Such an apparatus typically also comprises means for delivering energy to the source material. For example, the source material can be provided in conjunction with a heat source (e.g., a heating element) adapted for heating the source material by direct or indirect resistance, thermal conduction, radiation or induction, electron beam, laser irradiation, or arcing. Various processes and apparatuses are known in the art for coating substrates by upward evaporation.

In certain embodiments, the coater 99 includes at least one each upward CVD apparatus. Such an apparatus may comprise a gas delivery system for delivering precursor gas to the lower region of the coater. Preferably, such an apparatus comprises a gas-delivery outlet located below the path of the substrate travel, such that from the precursor gas, coating material condenses upon the bottom surface 12 of the substrate 10. A CVD apparatus of this nature will typically comprise a gas supply from which the precursor gas is delivered through the gas line, out of the gas outlet, and into the lower region of the coater. Any known CVD apparatus can be used. If so desired, such an upward CVD apparatus can be a plasma-enhanced chemical vapor deposition apparatus of the type described in U.S. patent application Ser. No. 10/739,887 now U.S. Pat. No. 7,157,123, entitled "Plasma-Enhanced Film Deposition" (Hartig).

In certain preferred embodiments, the coater 99 includes at least one upward coating apparatus comprising an ion gun. A lower ion gun of this nature can be adapted for carrying out any desired IAD process. For example, such an ion gun can be adapted for carrying out direct film deposition. Alternatively, such an ion gun can be part of an ion beam sputter deposition source comprising a lower sputtering target against which the ion gun accelerates ions, such that atoms of the target material are ejected from the target upwardly toward the substrate's bottom surface. These types of IAD methods are known in the art, as are many other suitable IAD methods. In one embodiment, the coater 99 includes one or more upper and/or lower ion guns adapted for carrying out an ion-assisted evaporation apparatus, such as those disclosed in the publication "Ion-Based Methods For Optical Thin Film Deposition" (Journal of Material Science; J. P. Marting, 21 (1986) 1-25), the entire contents of which are incorporated herein by reference.

Preferably, each upward coating apparatus is positioned beneath a gap 145 between an adjacent pair of transport rollers 310. This is perhaps best seen in FIG. 8. The gap 145 may result from conventional transport roller spacing. Alternatively, this gap 145 may be wider than conventional roller spacing. This can be accomplished by mounting the rollers that define each such gap 145 further apart and/or by decreasing the size of these rollers.

In certain embodiments, the coater 99 is operated (e.g., by operating the upward coating equipment) so as to deposit upon the bottom surface 12 of the substrate 10 a coating 16 (which in some cases comprises at least some high index film having a refractive index of at least about 2.3) having a total optical thickness of less than about 690 Å. In these embodiments, any traces of contact left on this coating 16 from the substrate support (e.g., from transport rollers) will tend to be invisible, or at least very difficult to perceive (e.g., substantially invisible), to the naked eye. In some embodiments of this nature, the coater 99 is operated (e.g., by operating the downward coating equipment) so as to deposit upon the top surface 14 of the substrate a coating 40 having a total optical thickness of at least about 1,000 Å. The coater 99, for example, can be operated to deposit a low-emissivity coating on the top surface of the substrate, and to deposit a surface-effect coating on the bottom surface of the substrate. In other embodiments of this nature, the coater is operated to deposit a mirror coating on the top surface of the substrate, and to deposit a surface-effect coating on the bottom surface of the substrate. When provided, the surface-effect coating is preferably selected from the group consisting of a photocatalytic coating, a hydrophilic coating, and a hydrophobic coating. In certain embodiments, there is provided a surface-effect coating comprising titanium oxide and/or silicon oxide. In one such embodiment, there is provided a surface-effect coating that is a photocatalytic coating comprising titanium oxide.

Low-emissivity coatings are well known in the art and typically include at least one infrared-reflective film region sandwiched between at least two transparent dielectric film regions. The infrared-reflective film, which typically comprises a conductive metal like silver, gold, or copper, reduces the transmission of radiant heat through the coating. The transparent dielectric film is used primarily to reduce visible reflectance and to control other properties of the coating, such as color. Commonly used transparent dielectrics include oxides of zinc, tin, indium, bismuth, and titanium, and alloys and mixtures thereof, as well as certain nitrides (e.g., silicon nitride). Useful low-emissivity coatings are described in U.S. patent application Ser. No. 09/728,435, the entire teachings of which are incorporated herein by reference.

When the downward coating equipment DE is operated to apply a low-emissivity coating onto the substrate's top surface 14, the method typically involves applying a thin (e.g., less than 200 Å) film of reflective metal between two transparent dielectric films. In some cases, this involves depositing the following sequence of films (e.g., moving outwardly from surface 14): at least one inner transparent dielectric film 30, a first reflective metal film 50, at least one intermediate transparent dielectric film 90, a second reflective metal film 150, and at least one outer transparent dielectric film 130. Such a method will commonly involve depositing each reflective metal film 50, 150 at a thickness of between about 40 Å and about 185 Å. The deposition of a variety of low-emissivity coatings using a variety of downward coating apparatuses is well known in the art. The present method can optionally include depositing other films in the coating 40. For example, the method can optionally include depositing a very thin (e.g., less than 30 Å) protective metal film 80, 180 over each reflective metal film 50, 150.

A variety of mirror coatings are well known in the art. Conventional mirror coatings comprise a thick reflective metal layer, such as silver, chromium, copper, or aluminum. When the downwardly-applied coating 40 is a mirror coating, the coating 40 can simply be a thick layer of reflective metal. If so desired, a protective film of transparent dielectric material can be applied over the face of the thick reflective metal layer opposite the face in contact with surface 14. As is known in the art, this will help protect the metal layer from chemical and physical attack. One could also employ a variety of mirror coatings known in the art which comprise a layer of transparent dielectric film on both sides of a reflective metal layer; many dichroic mirrors known in the art employ such a structure.

Thus, when the downward coating equipment DE is operated to apply a mirror coating onto the substrate's top surface 14, the method typically involves depositing a relatively thick (e.g., greater than 200 Å) film of reflective metal. The method can optionally include depositing other films as part of the mirror coating. In some cases, the application involves depositing the following sequence of films (e.g., moving outwardly away from surface 14): an inner transparent dielectric film, a reflective metal film, and an outer transparent dielectric film. The deposition of a variety of mirror coatings using a variety of downward coating apparatuses is well known in the art. In one embodiment, the downwardly-applied coating 40 is an electronic mirror coating, and the coating 40 on surface 14 is a transparent electrode film that is part of an electrochromic mirror. Reference is made to U.S. Pat. No. 6,193,378, the entire teachings of which are incorporated herein by reference.

Hydrophilic coatings have an affinity for water and tend to cause water applied to such coatings to sheet. Useful hydrophilic coatings are described in U.S. patent application Ser. No. 09/868,542 now U.S. Pat. No. 6,964,731, Ser. No. 09/868,543 now U.S. Pat. No. 6,974,629, Ser. No. 09/599,301 now U.S. Pat. No. 6,660,365, and Ser. No. 09/572,766 now abandoned, the entire contents of each of which are incorporated herein by reference. Hydrophobic coatings are applied to glass to repel water, thus causing water on such coatings to bead up, rather than spreading into a sheet. Useful hydrophobic coatings are described in U.S. Pat. No. 5,424,130, issued to Nakanishi, et al., the entire teachings of which are incorporated herein by reference.

In certain embodiments, the upward coating equipment UE is operated to deposit a transparent dielectric film region over the bottom surface 12 of the substrate 10, and to then deposit a hydrophilic or hydrophobic film region over the transparent dielectric film region. In these embodiments, the dielectric film region can be an oxide, such as tin oxide or another oxide having low emissivity. This film region can, for example, be a fluorine-doped tin oxide film, such as that described in U.S. Pat. No. 5,698,262, the entire contents of which are incorporated herein by reference. The hydrophilic or hydrophobic film region deposited over the transparent dielectric film region can comprise any known hydrophilic or hydrophobic film. In certain embodiments of this nature, the coating 16 is a low-emissivity, water-sheeting coating of the nature described in U.S. patent application Ser. No. 09/868,543, the entire contents of which are incorporated herein by reference.

Photocatalytic coatings typically comprise a semiconductor that can absorb ultraviolet radiation and can photocatalytically degrade organic materials such as oil, plant matter, fats, and greases. The most powerful of the photocatalysts appears to be titanium oxide (e.g., titanium dioxide). Useful photocatalytic coatings are described in U.S. Pat. No. 5,874,701 (Watanabe et al), U.S. Pat. No. 5,853,866 (Watanabe et al), U.S. Pat. No. 5,961,843 (Hayakawa et al.), U.S. Pat. No. 6,139,803 (Watanabe et al), U.S. Pat. No. 6,191,062 (Hayakawa et al.), U.S. Pat. No. 5,939,194 (Hashimoto et al.), U.S. Pat. No. 6,013,372 (Hayakawa et al.), U.S. Pat. No. 6,090,489 (Hayakawa et al.), U.S. Pat. No. 6,210,779 (Watanabe et al), U.S. Pat. No. 6,165,256 (Hayakawa et al.), and U.S. Pat. No. 5,616,532 (Heller et al.), the entire contents of each of which are incorporated herein by reference.

In certain embodiments, the upward coating equipment UE is adapted for applying a photocatalytic coating. In some embodiments of this nature, the upward coating equipment UE is adapted for applying a photocatalytic coating that comprises (and perhaps optimally consists essentially of) titanium oxide. In these embodiments, the upward coating equipment UE desirably comprises a source or sources of titanium and oxygen. For example, the upward coating equipment UE can optionally include a lower sputtering target comprising titanium (e.g., metallic titanium or titanium oxide). Conjointly, the lower region of the coater 99 adjacent such a target can optionally be provided with an oxidizing atmosphere. In one embodiment, the upward coating equipment UE comprises at least one lower sputtering target of the nature described in U.S. patent application 60/262,878, the entire teachings of which are incorporated herein by reference.

With photocatalytic titanium oxide coatings and other high index photocatalysts in particular, it is advantageous not to subject such coatings to subsequent overspraying, as overspray on these coatings can be more visible than overspray on other types of coatings, due to the somewhat reflective nature of these coatings. Thus, in certain embodiments, at least one upward coating apparatus is used to deposit a photocatalytic coating onto the bottom surface of the substrate, and this particular upward coating apparatus is not followed by (i.e., is further along the path of substrate travel than) any subsequent downward coating apparatus (or at least not any operated downward coating apparatus). This, however, is by no means required in all embodiments of the invention.

In preferred methods of the invention, the substrate 10 is conveyed along the path of substrate travel 60 in a generally or substantially horizontal configuration wherein a top major surface 14 of the substrate is oriented upwardly and a bottom major surface 12 of the substrate is oriented downwardly. In preferred embodiments, the first 40 and second 16 coatings are deposited upon the substrate 10 in a single pass of the substrate through the coater 99. Preferably, during conveyance of the substrate 10 through the coater 99, the downward coating equipment DE is operated to deposit film on the top surface 14 of the substrate (i.e., either directly upon surface 14 or upon a film previously deposited on such surface). In more detail, the downward coating equipment DE is operated to deposit upon the top surface of the substrate a first coating 40 having a structure that comprises a sequence of film regions (e.g., discrete film layers or graded film regions) characterized by, moving away from the top surface 14, a first film region comprising a first film material and a second film region comprising a second film material. In certain embodiments, the first film region consists essentially of the noted first film material, and the second film region consists essentially of the noted second film material.

In the present methods, the upward coating equipment UE is operated to deposit film on the bottom major surface 12 of the substrate 10. Preferably, the upward coating equipment UE is operated to deposit upon the bottom surface of the substrate a second coating 16 having a structure that is different from the structure of the first coating 40. While preferably being different than the structure of the first coating, the structure of the second coating 16 comprises a sequence of film regions characterized by, moving away from the bottom surface 12, a primary film region comprising the noted first film material (i.e., the same film material that the first film region of the first coating 40 comprises) and a secondary film region comprising the noted second film material (i.e., the same film material that the second film region of the first coating 40 comprises). In certain embodiments, the primary film region consists essentially of the noted first film material, and the secondary film region consists essentially of the noted second film material. In some cases, the noted first and second film materials are different materials.

Preferably, the first film region of the first coating 40 and the primary film region of the second coating 16 are deposited simultaneously in a common chamber (i.e., in a shared atmosphere) of the coater 99. Likewise, the second film region of the first coating 40 and the secondary film region of the second coating 16 preferably are deposited simultaneously in a common chamber of the coater.

Exemplary methods of the invention are perhaps best understood with reference to FIGS. 1-4 and 7. With reference to FIG. 1, the coater 99 can be seen to include downward DE and upward UE coating equipment. As noted above, the downward DE and upward UE coating equipment can both be the same basic type of coating equipment (e.g., the coater can have only sputtering equipment). Alternatively, the downward coating equipment DE can be one type of coating equipment, while the upward coating equipment UE is another type of coating equipment (e.g., the downward coating equipment can be conventional magnetron sputtering equipment, while the upward coating equipment is ion beam film deposition equipment). As another alternative, the upward coating equipment UE and/or the downward coating equipment DE can include a combination of different types of coating equipment (e.g., the coater can have some upward sputtering equipment and some upward evaporation equipment).

With reference to FIG. 1, the coater 99 includes at least eleven downward coating apparatuses D1-D11 and at least two upward coating apparatuses U1-U2. In this particular coater set-up, the first upward coating apparatus U1 is in the same coat zone CZ7 as the first downward coating apparatus D1. Preferably, these two coating apparatuses U1, D1 are in the same chamber/bay, such that they share a common deposition atmosphere. Thus, when a substrate is conveyed through the first coat zone CZ1 in this embodiment, the first upward U1 and first downward D1 coating apparatuses can be operated at the same time to simultaneously deposit film on both sides 12, 14 of the substrate 10. For example, the first film region of the first coating 40 and the primary film region of the second coating 16. As noted above, can be deposited in this manner respectively upon the top 14 and bottom 12 major surfaces of the substrate 10. These two film regions both comprise a first film material, which can be a variety of different materials, depending on the desired coating 16, 40 structures. In certain embodiments, the first film material here comprises silica. In other embodiments, the first film material here comprises zirconia. In still other embodiments, the first film material comprises tin oxide. In yet another embodiment, the first film material here comprises zinc oxide.

With continued reference to FIG. 1, following the film deposition carried out in the first coat zone CZ1, the substrate is conveyed through a plurality of subsequent coat zones CZ2-CZ10 in which only downward coating apparatuses D2-D10 are operated. The last downward coating apparatus D11 here is in the same coat zone CZ11 as the last upward coating apparatus U2. Thus, the last upward U2 and last downward D11 coating apparatuses here can be operated at the same time to simultaneously deposit the second film region of the first coating 40 and the secondary film region of the second coating 16 respectively upon the top 14 and bottom surfaces of the substrate 10. As noted above, these two film regions both comprise a second film material, which can be a variety of different materials, depending on the desired coating 16, 40 structures. In certain embodiments, the second film region comprises titania (e.g., $TiO_2$).

With reference to FIG. 2, the coater 99 includes at least eleven downward coating apparatus D1-D11 and at least three upward coating apparatuses V1-V3. In this coater set-up, the fist upward coating apparatus U1 is in the same coat zone CZ1, and preferably in the same chamber, as the fist downward coating apparatus D1. Thus, when a substrate 10 is conveyed through the fist coat zone CZ1 in this embodiment, the firs upward V1 and first downward D1 coating apparatuses can be operated at the same time to simultaneously deposit film on both sides 12, 14 of the substrate 10. For example, the "third" film region of the fist coating 40 and the "tertiary" film region of the second coating 16 can be deposited in this manner respectively upon the top 14 and bottom 11 surfaces of the substrate 10. As noted above, these two film regions both comprise a third film material, which can be a variety of different materials depending upon the desired coating 16, 40 structures. In certain embodiments, the third film material comprises silica. In other embodiments, the third film materials comprises zinc oxide.

With continued reference to FIG. 2, following the film deposition carried out in the first coat zone CZ1, the substrate is conveyed through a plurality of coat zones CZ2-CZ5 in which only downward coating apparatus D2-D5 are operated. Thereafter, the substrate is conveyed into a coat zone CZ6, and preferably into a single chamber/bay of this coat zone, that contains both a downward coating apparatus D6 and an upward coating apparatus V2. These upward V2 and downward D6 coating apparatuses can be operated at the same time to simultaneously deposit the "first" film region of the first coating 40 and the "primary" film region of the second coating 16. As noted above, these two film regions both comprise a first film material, which can be a variety of different materials, depending on the desired coating 16, 40 structures. In certain embodiments, this first film material comprises zirconia.

With the coater set-up of FIG. 2, the substrate is then conveyed through a plurality If coat zones CZ7-CZ10 in which only downward coating apparatuses D7-D10 are operated. Thereafter, the substrate is conveyed into a coat zone CZ11, and preferably a single chamber/bay of this coat zone, that contains both a downward coating apparatus D11 and an upward coating apparatus V3. Here, this coat zone CZ11 is shown as being the last coat zone in the coater 99, although this is not required. In this coat zone CZ11, the upward V3 and downward D11 coating apparatuses can be operated at the same time to simultaneously deposit the "second" film region of the first coating 40 and the "secondary" film region of the second coating 16. As noted above, these two film regions both comprise a second film material, which can be a variety of different materials, depending on the desired coating 16, 40 structures. In certain embodiments, the second film region comprises titania (e.g., $TiO_2$), as noted above.

Figure 5:
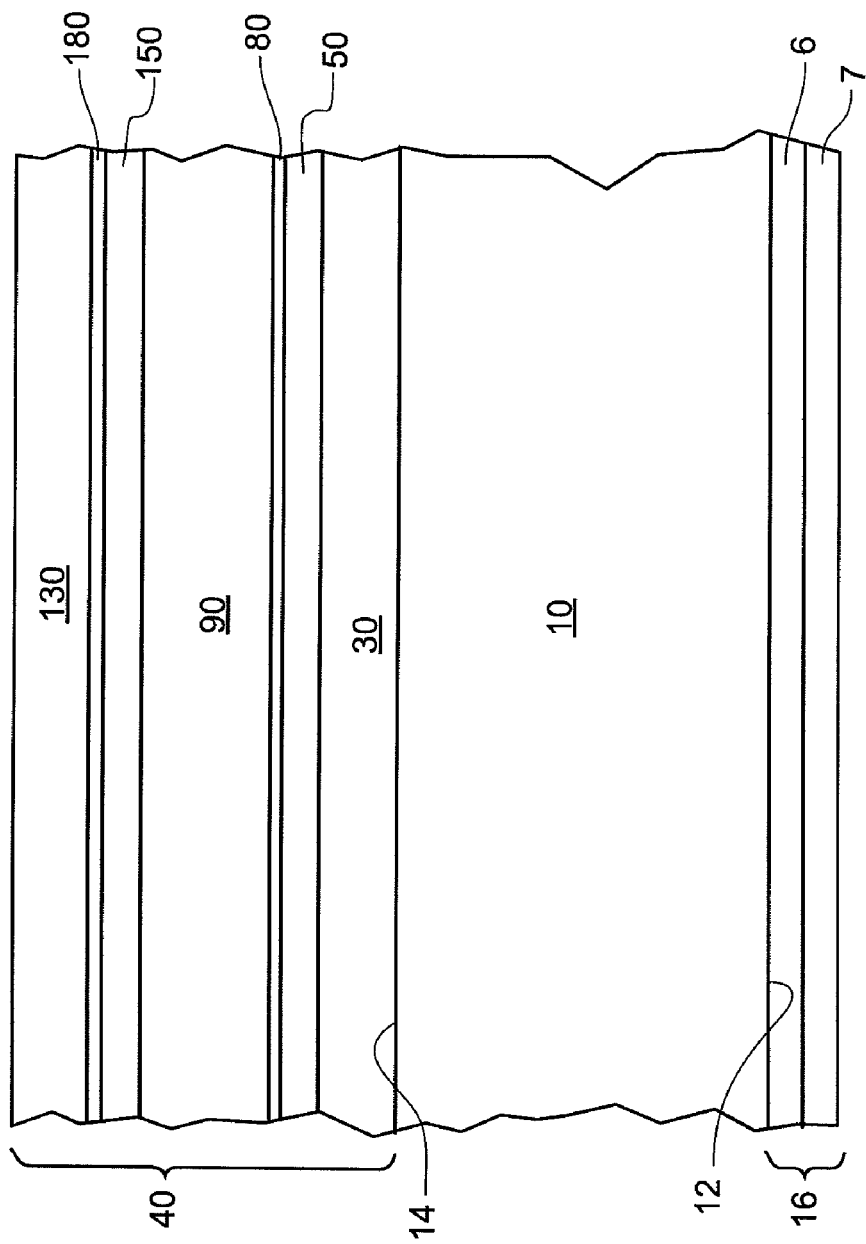
FIG. 5 is a schematic cross-sectional view of a coating on a substrate in accordance with certain embodiments of the invention.
Figure 6:
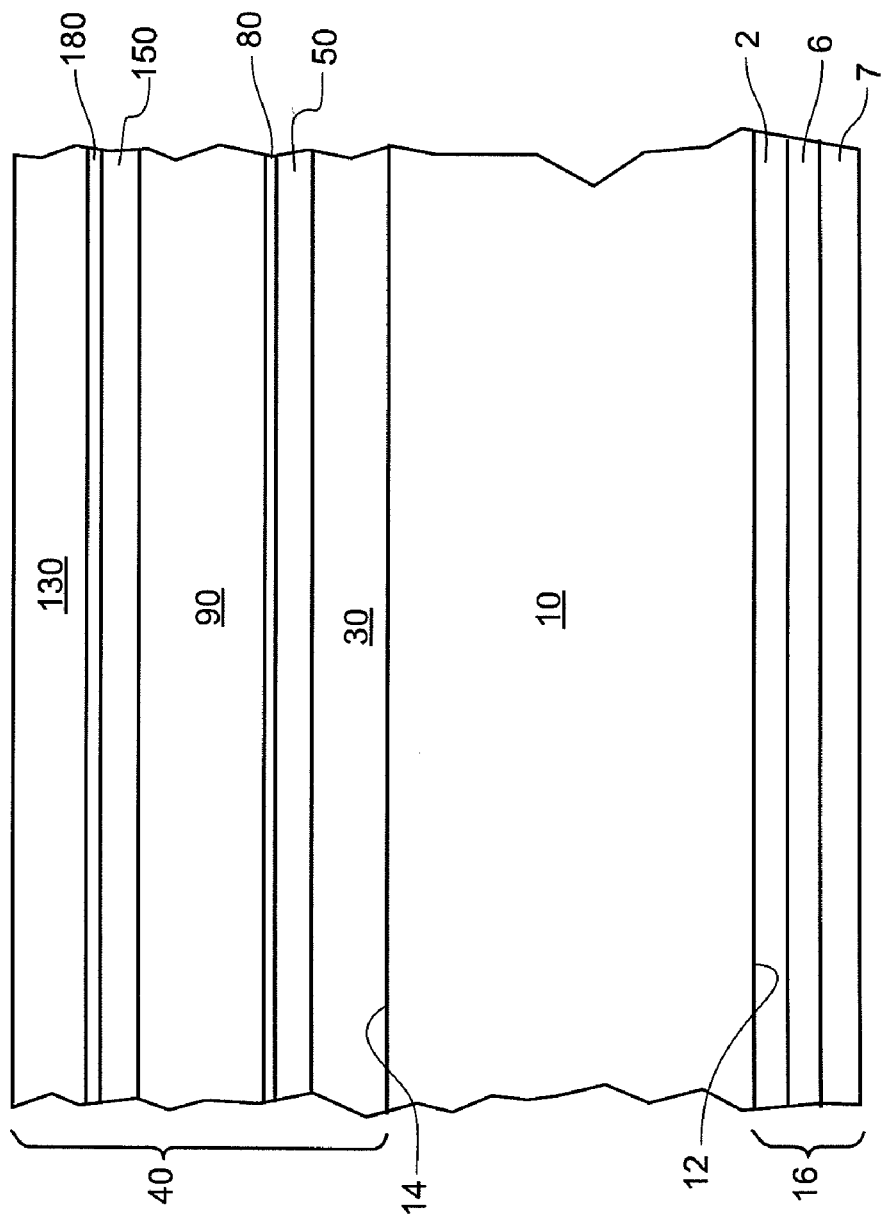
FIG. 6 is a schematic cross-sectional view of a coating on a substrate in accordance with certain embodiments of the invention.

FIGS. 5-6 depict particular embodiments wherein the coatings 40, 16 on opposite sides of the substrate 10 are characterized by a common sequence of film regions. It will be appreciated that other film regions can be, and commonly will be, included in the coatings 40, 16 in addition to the two or more sequenced film regions on each side of the substrate.

With reference to FIG. 5, it can be appreciated that the primary film region of the second coating 16 is shown as being film 6. The secondary film region of the second coating 16 is shown in FIG. 5 as being film 7. With respect to the first coating 40, it can be appreciated that any of the six innermost films (or a film region thereof) can be the noted first film region of the first coating 40. Conjointly, any of the six outermost films (or a film region thereof) can be the noted second film region of the first coating 40. In FIG. 5, the first coating 40 is a low-emissivity coating. In some embodiments of this nature, the second coating 16 is a photocatalytic coating. In one such embodiment, the second film region of the first coating 40 and the secondary film region 7 of the second coating 16 both comprise titanium oxide. In a particularly preferred embodiment of this nature, the first film region of the first coating 40 and the primary film region 6 of the second coating 16 both comprise silica or zirconia. Alternately, these two film regions can both comprise tin oxide or zinc oxide.

Thus, FIG. 5 exemplifies coating embodiments, wherein the first coating 40 is a low-emissivity coating. Here, the second coating 16 comprises two or more film regions 6, 7. FIG. 3 exemplifies certain related method/coater embodiments.

In certain embodiments, the first coating 40 includes a third film region between the noted first film region and the top major surface 14 of the substrate 10, and the second coating 16 includes a tertiary film region between the noted primary film region and the bottom major surface 12 of the substrate. FIG. 6 exemplifies certain coating embodiments of this nature. FIGS. 2, 4, and 7 exemplify related method/coater embodiments. Here, the third film region of the first coating 40 and the tertiary film region of the second coating 16 both comprise a third film material. Preferably, the third film region of the first coating 40 and the tertiary film region 7 of the second coating 16 are deposited simultaneously in a common chamber of the coater. In one embodiment of this nature, the third film region of the first coating 40 and the tertiary film region 7 of the second coating 16 both comprise silica. In another embodiment, the third film region of the first coating 40 and the tertiary film region 7 of the second coating 16 both comprise tin oxide.

In certain embodiments of the invention, the noted first and second film materials are different materials, the noted first and third film materials are different materials, and the noted second and third film materials are different materials. For example, in certain preferred embodiments, the first film material is zirconium oxide, the second film material is titanium oxide, and the third film material is silica. In these embodiments, the second coating 16 comprises, moving outwardly from surface 12, the following sequence of film regions: silica, zirconia, and titania. Here, other film regions can optionally be deposited between substrate surface 12 and the noted silica film region, between the noted silica and zirconia film regions, and/or further from substrate surface 12 than the noted titania film region. In these embodiments, the first coating 40 comprises the same sequence of film regions. That is, the first coating comprises a sequence characterized by, moving away from substrate surface 14, silica, zirconia, and titania film regions. Commonly, the first coating 40 will include other film regions between substrate surface 14, between the noted silica and zirconia film regions, and/or further from substrate surface 14 than the noted titania film region.

Reference is now made to FIG. 3. Here, there is shown a coater embodiment adapted for depositing on the top side 14 of the substrate 10 a low-emissivity coating comprising, moving outwardly from surface 14, the following sequence of film regions: zirconia, titania. In this embodiment, the noted zirconia film region can be replaced with a silica film region, if so desired. In FIG. 3, the substrate is first conveyed through a plurality of coat zones CZ1-CZ3 in which only downward coating apparatuses are operated. Here, the first three coat zones CZ1-CZ3 are operated so as to deposit a ZnO layer over substrate surface 14, a silver layer over this first ZnO layer, a niobium layer of this silver layer, and a zinc oxide layer over this niobium layer. Here, no films are deposited on the bottom side 12 of the substrate during conveyance of the substrate through the first three coat zones CZ1-CZ3 of the coater 99. The thus coated substrate is then conveyed into a coat zone CZ4 in which zirconia is applied to both sides of the substrate. Thereafter, the substrate is conveyed into a coat zone CZ5 in which titania is applied to both sides of the substrate. The substrate is then conveyed through six more coat zones CZ5 in which titania is applied to both sides of the substrate. The substrate is then conveyed through six more coat zones CZ6-CZ11 in which only downward coating apparatuses are operated. These six coat zones are operated so as to deposit a zirconia layer over the titania layer on the substrate's top side 14, a zinc oxide layer over this zirconia layer, a silver layer over this zinc oxide layer, a niobium layer over this silver layer, a silicon nitride layer of this niobium layer, a titanium nitride layer over this silicon nitride layer, and finally an outermost silicon nitride layer.

Reference is now made to FIGS. 4 and 7. Here, there are shown two coater embodiments adapted for depositing on the top side of a substrate 10 a first coating 40 comprising, moving outwardly from substrate surface 14, the following sequence of film regions: silica, zirconia, and titania. These coater embodiments are adapted for depositing on the bottom side of the substrate a second coating 16 comprising, moving outwardly from substrate surface 12, the same sequence of film regions. In both of these embodiments, the top 14 and bottom 12 sides of the substrate 10 are coated with silica by operating in the first coat zone CZ1, and preferably in the first chamber of this coat zone, one or more upward coating apparatuses and one or more downward coating apparatuses. In FIG. 34, the substrate is then conveyed through a plurality of other coat zones in which downward coating apparatuses are operated. In FIG. 4, the substrate is then conveyed through two subsequent coat zones CZ3-CZ3 before being conveyed through two adjacent coat zones CZ4, CZ5 in which both upward and downward coating apparatuses are operated. In the first CZ4 of these two coat zones CZ4-CZ5, zirconia is simultaneously deposited on both sides of the substrate, and in the second CZ5 of these two coat zones CZ4-CZ5, titania is simultaneously deposited on both sides of the substrate. In FIG. 7, the substrate is then conveyed through seven subsequent coat zones CZ2-CZ9 before being conveyed through two adjacent coat zones CZ9-CZ10 in which both downward and upward coating apparatuses are operated. Here, these two coat zones CZ9-CZ10 are the last two coat zones of the chamber, although this is not required. In the first CZ9 of these two coat zones CZ9-CZ10, zirconia is simultaneously deposited on both sides of the substrate, and in the second CZ10 of these two coat zones CZ9-CZ10, titania is simultaneously deposited on both sides of the substrate.

Thus, certain embodiments of the invention provide a substrate (e.g., a sheet-like substrate, preferably a glass sheet) having first and second generally-opposed major surfaces. The substrate's first (or "top") major surface 14 bears a first coating 40, and the substrate's second (or "bottom") major surface 12 bears a second coating 16. The first coating 40 has a structure that comprises a sequence of film regions characterized by, moving away from the substrate's first major surface 14, a first film region comprising a first film material and a second film region comprising a second film material. Here, the second coating 16 has a structure that is different from the structure of the first coating 40. Conjointly, the structure of the second coating 16 comprises a sequence of film regions characterized by, moving away from the substrate's second major surface 12, a primary film region comprising the noted first film material and a secondary film region comprising the noted second film material.

In certain embodiments, the noted first and second film materials are different materials. As noted above, the first coating 40 is a low-emissivity coating in some embodiments. In certain preferred embodiments of this nature, the second coating 16 is a photocatalytic coating. In some such embodiments, the second film region of the first coating 40 and the secondary film region of the second coating 16 both comprise titanium oxide. As noted above, in one embodiment of this nature, the first film region of the first coating 40 and the primary film region of the second coating 16 both comprise zirconium oxide.

Optionally, the first coating 40 can include a third film region between the noted first film region and the first major surface 14 of the substrate, and the second coating 16 can include a tertiary film region between the noted primary film region and the second major surface 12 of the substrate. When provided, the third film region and the tertiary film region desirably both comprise a third film material. In one embodiment, the third film region of the first coating 40 and the tertiary film region of the second coating 16 both comprise silica. In certain embodiments, the noted first and second film materials are different materials, the noted first and third film materials are different materials, and the noted second and third film materials are different materials. In some such embodiments, the first film region of the first coating 40 and the primary film region of the second coating 16 both comprise zirconia, the second film region of the first coating 40 and the secondary film region of the second coating 16 both comprise titania, and the third film region of the first coating 40 and the tertiary film region of the second coating 16 both comprise silica.

While there have been described what are believed to be preferred embodiments of the present invention, those skilled in the art will recognize that other and further changes and modifications can be made without departing from the spirit of the invention, and all such changes and modifications should be understood to fall within the scope of the invention.

What is claimed is:

1. A method for depositing sequenced coatings on opposite sides of a sheet-like substrate, each of the coatings including a shared sequence of film regions and yet being different coatings from each other, the method comprising:
    a) providing a coater having downward coating equipment, upward coating equipment, and a substrate support defining a path of substrate travel extending through the coater, the downward coating equipment being mounted above the path of substrate travel, and the upward coating equipment being mounted below the path of substrate travel;
    b) conveying a glass sheet along the path of substrate travel in a generally horizontal orientation wherein a top major surface of the glass sheet is oriented upwardly and a bottom major surface of the glass sheet is oriented downwardly;
    c) operating the downward coating equipment to deposit upon the top major surface of the glass sheet a first coating having a structure that comprises the shared sequence of film regions and is characterized by, moving away from the top major surface of the glass sheet, a first film region comprising a first film material and a second film region comprising a second film material; and
    d) operating the upward coating equipment to deposit upon the bottom major surface of the glass sheet a second coating having a structure that is different from the structure of the first coating in that one or both of the first and second coatings includes at least one film region in addition to those film regions that are part of the shared sequence, the structure of the second coating comprising the shared sequence of film regions and being characterized by, moving away from the bottom major surface of the glass sheet, a primary film region comprising said first film material and a secondary film region comprising said second film material;
    wherein the first film region of the first coating and the primary film region of the second coating are deposited simultaneously in a shared chamber of the coater, and the second film region of the first coating and the secondary film region of the second coating are deposited simultaneously in a shared chamber of the coater.

2. The method of claim 1 wherein said coater is a vacuum coater, said downward coating equipment comprises at least one downward vacuum-coating apparatus, and said upward coating equipment comprises at least one upward vacuum-coating apparatus.

3. The method of claim 2 wherein said downward coating equipment comprises a plurality of downward vacuum-coating apparatuses, and said upward coating equipment comprises a plurality of upward vacuum-coating apparatuses.

4. The method of claim 1 wherein the first and second coatings are deposited upon the glass sheet in a single pass of the glass sheet through the coater.

5. The method of claim 1 wherein the glass sheet is a large-area substrate having a major dimension of at least about 0.5 meter.

6. The method of claim 1 wherein the glass sheet is on the substrate support during said conveyance, and wherein other sheets of glass are also on the substrate support during said conveyance, such sheets of glass being spaced-apart from one another on the substrate support and conveyed in such a spaced-apart configuration.

7. The method of claim 1 wherein the substrate support comprises a plurality of spaced-apart transport rollers, the method comprising rotating at least one of the transport rollers to facilitate said conveyance of the glass sheet, such that the bottom major surface of the glass sheet comes into direct physical contact with the rollers during said conveyance.

8. The method of claim 1 wherein said first and second film materials are different materials.

9. The method of claim 1 wherein the first coating is a low-emissivity coating.

10. The method of claim 9 wherein the second coating is a photocatalytic coating.

11. The method of claim 10 wherein said second film material is titania, such that the second film region of the first coating and the secondary film region of the second coating both comprise titania.

12. The method of claim 11 wherein said first material is silica, such that the first film region of the first coating and the primary film region of the second coating both comprise silica.

13. The method of claim 11 wherein said first film material is zirconia, such that the first film region of the first coating and the primary film region of the second coating both comprise zirconia.

14. The method of claim 1 wherein the first coating includes a third film region between said first film region and the top major surface of the glass sheet, and wherein the second coating includes a tertiary film region between the primary film region and the bottom major surface of the glass sheet, the third film region of the first coating and the tertiary film region of the second coating both comprising a third film material, the third film region of the first coating and the tertiary film region of the second coating being deposited simultaneously in a shared chamber of the coater.

15. The method of claim 14 wherein said first and second film materials are different materials, said first and third film materials are different materials, and said second and third film materials are different materials.

16. The method of claim 14 wherein said third film material is silica, such that the third film region of the first coating and the tertiary film region of the second coating both comprise silica.

17. The method of claim 16 wherein said first film material is zirconia, such that the first film region of the first coating and the primary film region of the second coating both comprise zirconia, and wherein said second film material is titania, such that the second film region of the first coating and the secondary film region of the second coating both comprise titania.

18. The method of claim 1 wherein the upward coating equipment comprises upward coating apparatuses each positioned beneath a gap between two adjacent transport rollers.

19. The method of claim 1 wherein the primary film region of the second coating consists essentially of said first film material, and the secondary film region of the second coating consists essentially of said second film material.

20. The method of claim 1 wherein said first film material comprises tin oxide.

21. A method for depositing sequenced coatings on opposite sides of a sheet-like substrate, each of the coatings including a shared sequence of film regions and yet being different coatings from each other, the method comprising:
   a) providing a coater having downward coating equipment, upward coating equipment, and a substrate support defining a path of substrate travel extending through the coater, the downward coating equipment being mounted above the path of substrate travel, and the upward coating equipment being mounted below the path of substrate travel;
   b) conveying a glass sheet along the path of substrate travel in a generally horizontal orientation wherein a top major surface of the glass sheet is oriented upwardly and a bottom major surface of the glass sheet is oriented downwardly;
   c) operating the downward coating equipment to deposit upon the top major surface of the glass sheet a first coating having a structure that comprises the shared sequence of film regions and is characterized by, moving away from the top major surface of the glass sheet, a first film region comprising a first film material and a second film region comprising a second film material; and
   d) operating the upward coating equipment to deposit upon the bottom major surface of the glass sheet a second coating having a structure that is different from the structure of the first coating in that one or both of the first and second coatings includes at least one film region in addition to those film regions that are part of the shared sequence, the second coating comprising high index film having a refractive index of at least about 2.3 and having a total optical thickness of less than about 690 Å, the structure of the second coating comprising the shared sequence of film regions and being characterized by, moving away from the bottom major surface of the glass sheet, a primary film region comprising said first film material and a secondary film region comprising said second film material;
   wherein the first film region of the first coating and the primary film region of the second coating are deposited simultaneously in a shared chamber of the coater, and the second film region of the first coating and the secondary film region of the second coating are deposited simultaneously in a shared chamber of the coater.

22. The method of claim 21 wherein said first coating is deposited so as to have a total optical thickness of at least about 1,000 Å.

* * * * *